United States Patent
Al-Bender et al.

(10) Patent No.: US 8,653,719 B2
(45) Date of Patent: Feb. 18, 2014

(54) ACTIVE 3D.O.F. STIFFNESS ELEMENT

(75) Inventors: Farid Al-Bender, Kessel-Lo (BE); El Said Mohamed Mohamed, Leuven (BE); Hendrik Van Brussel, Kessel-Lo (BE)

(73) Assignee: Katholieke Universiteit Leuven, K.U.Leuven R&D, Leuven (BE)

( * ) Notice: Subject to any disclaimer, the term of this patent is extended or adjusted under 35 U.S.C. 154(b) by 50 days.

(21) Appl. No.: 13/500,624

(22) PCT Filed: Oct. 5, 2010

(86) PCT No.: PCT/BE2010/000069
§ 371 (c)(1),
(2), (4) Date: Apr. 5, 2012

(87) PCT Pub. No.: WO2011/041858
PCT Pub. Date: Apr. 14, 2011

(65) Prior Publication Data
US 2012/0204550 A1  Aug. 16, 2012

(30) Foreign Application Priority Data

| Oct. 5, 2009 | (GB) | 0917368.3 |
| Oct. 7, 2009 | (GB) | 0917588.6 |
| Jun. 14, 2010 | (GB) | 1009944.8 |

(51) Int. Cl.
*H01L 41/09* (2006.01)
*H02N 2/00* (2006.01)

(52) U.S. Cl.
USPC .......................... 310/328; 310/26

(58) Field of Classification Search
USPC .......... 310/26, 311, 323.01–323.19, 328, 348
See application file for complete search history.

(56) References Cited

U.S. PATENT DOCUMENTS

| 5,765,817 | A | 6/1998 | Breitbach |
| 2002/0046564 | A1 | 4/2002 | Rastegar et al. |
| 2004/0035108 | A1 | 2/2004 | Szilagyi |
| 2004/0183401 | A1 | 9/2004 | Lubitz et al. |
| 2005/0284713 | A1 | 12/2005 | Fischer |
| 2006/0225977 | A1 | 10/2006 | Melz et al. |
| 2010/0109219 | A1 | 5/2010 | Melz et al. |

FOREIGN PATENT DOCUMENTS

| DE | 19925982 A1 | 12/2000 |
| DE | 102004030935 B3 | 9/2005 |
| EP | 756103 A1 | 10/1999 |
| WO | 9967652 A1 | 12/1999 |
| WO | 9967652 A9 | 3/2000 |
| WO | 0219441 A1 | 3/2002 |
| WO | 2005010399 A1 | 2/2005 |
| WO | 2011/041858 A2 | 4/2011 |

OTHER PUBLICATIONS

PCT International Search Report for PCT/BE2010/000069 dated Apr. 13, 2011.

*Primary Examiner* — Thomas Dougherty
(74) *Attorney, Agent, or Firm* — TraskBritt

(57) ABSTRACT

A dynamic three-degree-of-freedom actuator/transducer element comprising at least three piezoceramic actuators and force sensors, as integrated stacks, which are preloaded in the housing by a low-stiffness tension bar, and are constrained, by means of a flexible shell, against shear force and torsion moment, whereby the element, when powered by external voltage source, is able to generate a dynamical axial force and displacement and dynamical bending and moment in the two principal tilt degrees of freedom around two orthogonal axes perpendicular to the principal displacement. When subjected to an axial force or a tilting moment, the transducer is able to generate charges that are proportional to the exerted force and moments.

27 Claims, 8 Drawing Sheets

Sec. A-A.  Sec. C-C.  Sec. B-B.

(a)          (b)

(c)          (d)

ACTIVE 3D.O.F. STIFFNESS ELEMENT

CROSS-REFERENCE TO RELATED APPLICATIONS

This application is a national phase entry under 35 U.S.C. §371 of International Patent Application PCT/BE2010/000069, filed Oct. 5, 2010, designating the United States of America and published in English as International Patent Publication WO 2011/041858 A2 on Apr. 14, 2011, which claims the benefit under Article 8 of the Patent Cooperation Treaty and under 35 U.S.C. §119(e) to Great Britain Patent Application Serial No. 1009944.8, filed Jun. 14, 2010, to Great Britain Patent Application Serial No. 0917588.6, filed Oct. 7, 2009, and to Great Britain Patent Application Serial No. 0917368.3, filed Oct. 5, 2009.

STATEMENT REGARDING FEDERALLY SPONSORED RESEARCH OR DEVELOPMENT

Not applicable

THE NAMES OF THE PARTIES TO A JOINT RESEARCH AGREEMENT

Not applicable

INCORPORATION-BY-REFERENCE OF MATERIAL SUBMITTED ON A COMPACT DISC OR AS A TEXT FILE VIA THE OFFICE ELECTRONIC FILING SYSTEM (EFS-WEB)

Not applicable

STATEMENT REGARDING PRIOR DISCLOSURE BY THE INVENTOR OR A JOINT INVENTOR

Not applicable

BACKGROUND OF THE INVENTION

1. Field of the Invention

The disclosure relates generally to an active element (an active structure controller, active vibration controller, active damping controller or active stiffness component, more particularly to a dynamic three-degree-of-freedom (3DOF) actuator/transducer element hereinafter called "Active 3D.O.F." Stiffness Element (A3DSE) and, more particularly, to a mechanical design of an A3DSE and design issues related to the hardware involved in the A3DSE. In one embodiment, the A3DSE active element involves sensor and actuator components, mechanical interfaces between the active element and the machine and the assembly process and connection mechanisms. A specific embodiment is a dynamic three-degree-of-freedom actuator/transducer element (combined actuator and transducer element) comprising at least three piezoceramic actuators and force sensors, which are preloaded in the housing by a low-stiffness tension bar, and are constrained, by means of a flexible shell, against shear force and torsion moment, whereby the actuator/transducer element, when powered by an external voltage source, is able to generate a dynamical axial force and displacement and dynamical bending and moment in the two principal tilt degrees of freedom around two orthogonal axes perpendicular to the principal displacement, and when subjected to an axial force or a tilting moment, the transducer is able to generate charges that are proportional to the exerted force and moments.

2. Description of Related Art

Vibration control can be split up into passive and active methods. Passive vibration control methods directly deal with the physical properties of a machine, like its stiffness, mass and damping. Passive vibration control may boil down to a basic structural change, to the use of other materials, or simply to the addition of a "passive" element, i.e., an element the function of which does not need an external power source.

Active vibration control methods, on the other hand, depend on the use of an external power source. Active control traditionally belongs to the field of the control engineer. It is based on the use of sensors, actuators, signal conditioning electronics and control electronics, cooperating such that possible errors that may occur within a machine are anticipated or compensated for (Preumont 2002).

SUMMARY OF THE INVENTION

There is a need in the art to provide machines with elements that can compensate for the vibration modes of the mechanical structure elements. The main function of the A3DSE within the machine's structural elements, such as struts, is to compensate for the vibrations of the mechanical structural elements where it will be installed. In order to achieve this with the A3DSE, this element is provided with the ability to measure local deflections and produce local displacements to compensate for them.

The Active 3DOF Stiffness Element (A3DSE) is based on the incorporation of 3DOF position actuators and a set of collocated 3DOF force sensors within a mechanical structure, through suitable mechanical and electrical/electronic interfaces. Each actuator and sensor pair have been combined into a single piezoelectric stack, working at the same line of action. This single piezoelectric stack, as shown in FIG. 1, will be referred to throughout this report as actuator-sensor-stack.

To end up with a proper design for the A3DSE, the design requirements were the beginning of the design process set to cover general mechanical and control requirements for a proper functionality of the A3DSE within the machine elements where it will be inserted.

From FIG. 1, it can be seen that the A3DSE in one embodiment is built up of three piezoelectric actuator-sensor stacks (1), a so-called flexible shell coupling (2), a preload bolt (3), with two accompanying nuts (4), and spring elements (5).

The actuator-sensor-stack comprises a multiple-layer sensor stack on top of a multiple-layer actuator stack with the same cross-section, but much longer than the sensor stack. Between the sensor and the actuator is a passive ceramic layer in order to electrically insulate the last upper electrode of the actuator from the last lower electrode of the sensor. Also, the stack is equipped with two passive ceramic layers at the outer ends in order to insulate the electrodes of the sensor and actuator stacks from the mechanical structure's surfaces where they will contact each other.

The invention is broadly drawn to a dynamic three-degree-of-freedom actuator/transducer element comprising at least three piezoceramic actuators and force sensors, which are preloaded in the housing by a low-stiffness tension bar, and are constrained, by means of a flexible shell, against shear force and torsion moment.

In one aspect, this dynamic three-degree-of-freedom actuator/transducer element has at each end a screw thread with which it can be connected to a structure or element in order to exert force or moments on it.

In still another aspect, this dynamic three-degree-of-freedom actuator/transducer element has piezoceramic actuators of the low voltage, multi-layer type.

In still another aspect, this dynamic three-degree-of-freedom actuator/transducer element has piezoceramic actuators of the high voltage, single or multiple crystal type.

In still another aspect, this dynamic three-degree-of-freedom actuator/transducer element has magnetostrictive actuators instead of piezoceramic actuators.

Another aspect is a dynamic three-degree-of-freedom actuator/transducer element comprising at least three piezoceramic actuators and force sensors, which are preloaded in the housing by a low-stiffness tension bar, and are constrained, by means of a flexible shell, against shear force and torsion moment, which, when powered by external voltage source, this actuator/transducer is able to generate a dynamical axial force and displacement and dynamical bending and moment in the two principal tilt degrees of freedom around two orthogonal axes perpendicular to the principal displacement.

Another aspect is a dynamic three-degree-of-freedom actuator/transducer element comprising at least three collocated piezoceramic actuators and force sensors, which, when subjected to an axial force or a tilting moment, the transducer is able to generate charges that are proportional to the exerted force and moments.

Another aspect is the integration of the sensor and the actuator stacks to be collocated at the same line of action, which guarantees more stability from the control point of view.

Another aspect is that the flexible-shell coupling has the same axisymmetrical bending stiffness at the three longitudinal planes where the three piezo collocated sensor-actuator stacks are located. This guarantees the use of the same controller for all of the three piezoelectric sensor-actuator stacks to compensate for the bending deflection modes independently.

Another aspect is that this axisymmetrically collocated independent configuration makes it possible for the A3DSE to compensate the bending deflection independent of the assembly orientation of the element with respect to the structure where it will be inserted.

A three-degree-of-freedom actuator/transducer element in the meaning of some embodiments is an actuator/transducer element that can move up and down along its X axis (longitudinal movement) and that can roll over or bend over.

The advantages of the A3DSE active element or the three-degree-of-freedom actuator/transducer element are that it can be easily assembled, that it remains symmetrical, that it has an improved regular rolling over or bending-over movement, and that it is protected against break risk or torsion risk and eventual destruction by sliding or shear forces.

This is achievable on a three-degree-of-freedom actuator/transducer element with particular technical features of the A3DSE active element. For instance, the A3DSE active element, that has at least one tension bar (which comprises preload bolts, preload nuts and spring elements (respectively (3), (4) and (5) in FIG. 1)), absorbs pressing and tearing forces and has a low stiffness (e.g., a stiffness that is order-of-magnitude lower than the stiffness of the actuator (e.g., the piezoceramic actuator). This shell prevents torsion but is extendible and contractible along its longitudinal axis (X axis) in the axial direction and in the two-tilt direction. The spring elements can be helical springs, dishwasher springs or other elastic devices, such as a coil of wire, that regains its original shape after being compressed or extended. The at least three actuators are parallel along the X axis or longitudinal axis of the three-degree-of-freedom actuator/transducer element. These have a force sensor (force sensor integrated stacks) at one end and a ball-shaped protrusion at the other end. For each of the actuators or force sensor integrated stacks, the force sensors contact or support on a port (right port (12) in FIG. 7) and the ball-shaped protrusion fits in a concave pit in the other port (left port, (13) in FIG. 7). This assembly of (1) actuator-sensor stacks, (11) hemispherical cap, (12) right port, and (13) left port is surrounded by a flexible shell or a flexible shell device. The flexible shell is foreseen with longitudinal excisions (slots or grooves) axial around the axis of the three-degree-of-freedom actuator/transducer element or in circumventional position around the three-degree-of-freedom actuator/transducer element.

The three-degree-of-freedom actuator/transducer element of the embodiments can be used in microdevices (for instance, micropositioning systems). They can be used in mesosystems (e.g., as a machine tool or a robot part) and in macrosystems (e.g., building or bridges) for tempering of vibration.

In a particular embodiment, a force sensor can produce a signal indicative of force and a controller can control and activate the programmable actuators to adapt the actuators in relation to these forces. For optimal control, these force sensors are connected with a computer comprising a controller or with an electronic controller to process the sensor signals into a signal that activates the actuator. Such force sensors can be in connection with transducers to transfer this in electrical signals that can be sensed by a computer or electronic controller. The three-degree-of-freedom actuator/transducer element that comprises force sensors or other detectors disposed within the three-degree-of-freedom actuator/transducer element and configured to record a quantity of forces, displacements, velocities or accelerations according to a recording protocol and generate an information signal representing the quantity, can be foreseen or connected with a device for monitoring and collecting a quantity associated with the force sensors, comprising: a memory coupled to the detector and configured to store data representing the information signal, and a transponder coupled to the memory and configured to transmit the data in response to receiving of an interrogation signal.

Additional embodiments will become apparent from the detailed description given hereinafter. However, it should be understood that the detailed description and specific examples, while indicating preferred embodiments of the invention, are given by way of illustration only, since various changes and modifications within the scope of the invention will become apparent to those skilled in the art from this detailed description. It is to be understood that both the foregoing general description and the following detailed description are exemplary and explanatory only and are not restrictive of the invention, as claimed.

DETAILED DESCRIPTION OF THE INVENTION

Figure 1:
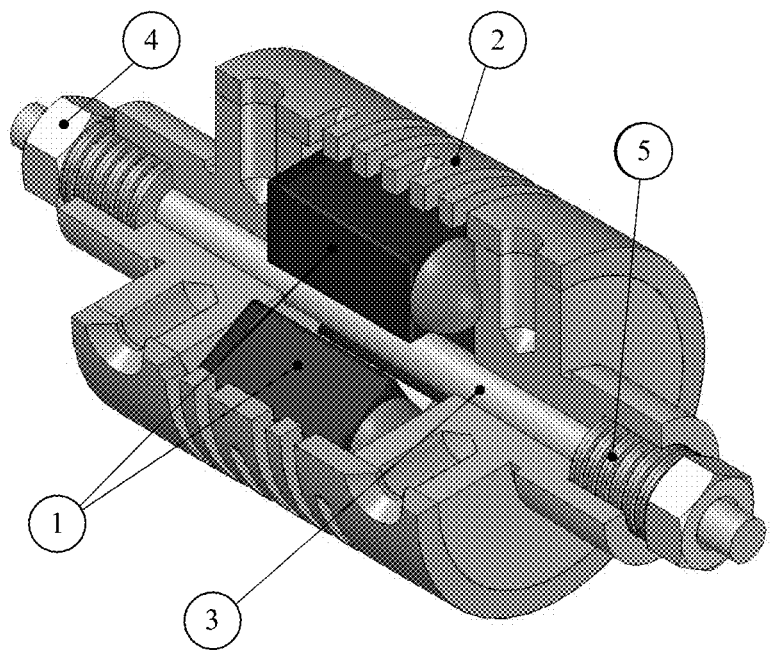
FIG. 1 depicts an active 3DOF Stiffness Element (A3DSE) with the following components: (1) actuator-sensor piezoelectric stacks, (2) flexible shell coupling, (3) preload bolt, (4) preload nuts, and (5) spring elements.

The following detailed description refers to the accompanying drawings. The same reference numbers in different drawings identify the same or similar elements. Also, the following detailed description does not limit the invention. Instead, the scope of the invention is defined by the appended claims and equivalents thereof.

A "charge" in this application is an energy or energetic impulse applied to some object or entity. For instance, a charge may be an electric charge (a property that determines the electromagnetic interaction of subatomic particles), a magnetic charge (a property of theoretical magnetic monopoles), or a physical charge (susceptibility of a body to one of the fundamental forces).

A major factor that limits the performance of dynamic-positioning machines, such as PKMs, is their propensity to vibrations, which will impose limitations on size of the working space, settling time and/or positioning accuracy. The objective of this research is to develop an Active 3DOF Stiffness Element (A3DSE) that can be installed at appropriate locations of a machine, which could dynamically compensate for the vibrations of the mechanical structure by actuating in three degrees of freedom: one axial and two bending. The design idea is based on the incorporation of three piezoelectric displacement actuators, each equipped with a collocated piezoelectric force sensor, in an axisymmetrical configuration within a mechanical holding structure, using suitable mechanical and electronic interfaces. First, the mechanical design requirements and the design procedure for each of its components are discussed. Second, a dynamic identification and modeling of the A3DSE element is presented. Finally, the effectiveness of this element for active control is experimentally illustrated.

Vibration control can be split up into passive and active methods. Passive vibration control methods involve the modification of a machine's physical properties, like its stiffness, mass, and damping. These may be subdivided into four categories: vibration isolation, structural re-design, added damping, and localized additions.

Active vibration control methods, on the other hand, depend on the use of an external power source. They are based on the use of sensors, actuators, signal conditioning electronics and control electronics, cooperating such that possible errors, which may occur within a machine, are anticipated or compensated for. Active control systems may be divided into: feedforward, feedback, and their combination. Feedforward systems rely on some predictive measure of the incoming disturbance in order to cancel the disturbance. Feedback systems aim to attenuate the residual effects of the disturbance after it has passed.

In some embodiments, an active element is presented that can be installed, in a modular way, at appropriate locations of a machine, which could dynamically compensate for the vibrations of the mechanical structure. This compensation is achieved by the application of an appropriate type of closed-loop control.

The device can actuate in three degrees of freedom: one translation and two tilt (or bending).

The design incorporates three piezoelectric displacement actuators, each equipped with a collocated, piezoelectric force sensor, in an axisymmetrical configuration within a mechanical holding structure, using suitable mechanical and electronic interfaces (see FIG. 1).

A proper design for the A3DSE is obtainable:

1) If the A3DSE is able to deform independently in the three DOFs to compensate for the vibration modes of a given structure. The axial deflections (elongation/contraction) and the bending deflection at any direction can be measured and compensated for independently using a suitable number of sensors and actuator elements with appropriate placement.

2) As the actuators and sensors elements will be piezoelectric stacks, they should not be subjected to bending and shear stresses, nor to tensile loads.

3) The piezoelectric actuator stacks should have sufficient stroke, in order to compensate for the expected vibration mode levels and operate within a sufficiently large frequency range.

4) The piezoelectric force sensor stacks should have sufficient sensitivity for the expected force range to provide an appropriate feedback signal for position control and have a sufficiently large frequency range.

5) It should be possible to insert/integrate the A3DSE in the machine elements by an interface having sufficient strength and stiffness.

Figure 4:
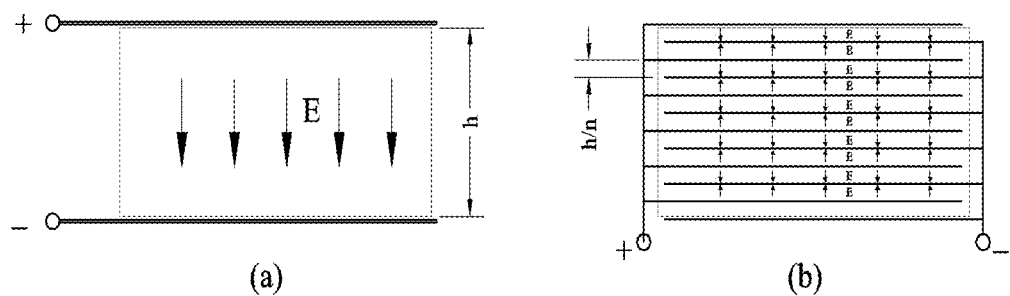
FIG. 4 illustrates (a) a single-layer piezoelectric element and (b) a multi-layer piezoelectric element.

The piezoelectric stacks within the A3DSE are distributed axisymmetrically, on a circle perpendicular to the longitudinal axis of the preloading bolt, with equal angle differences of 120° (as shown in FIG. 1), which guarantees: equal preload stress distribution for each piezoelectric stack and equal elongation contraction to compensate for the axial deflection modes. The actuator-sensor stacks are comprised of a multi-layer sensor stack on top of a multi-layer actuator stack with the same cross-section (nine times longer than the sensor stack). There are passive ceramic layers on the top and bottom and in between the sensor and the actuator stacks (see FIG. 4). The side faces of the actuator-sensor stacks are coated by a protective silicone conformal coating thickness of approximately 0.1 mm. To describe the behavior of both a piezoelectric position actuator stack and a piezoelectric force sensor stack, we can use one of two sets of equations, linearly relating the electrical variables and the mechanical variables at the stack:

$$\begin{pmatrix} Q \\ x \end{pmatrix} = \begin{bmatrix} C & nd_{33} \\ nd_{33} & 1/K_a \end{bmatrix} \begin{pmatrix} V \\ f \end{pmatrix} \quad (10)$$

Figure 3:
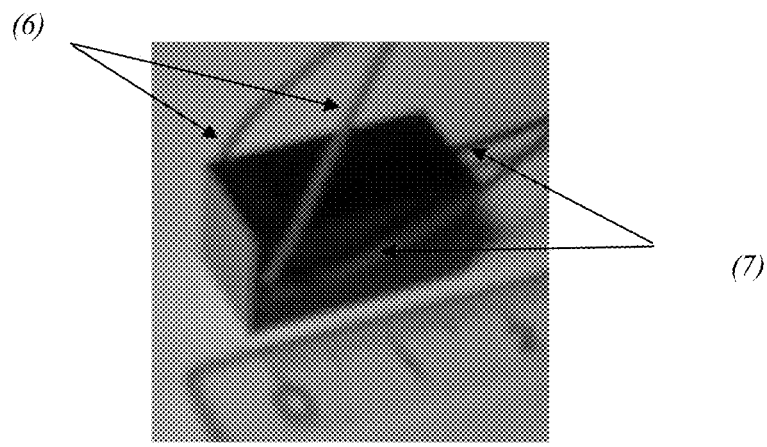
FIG. 3 is a photograph of the actuator-sensor stack and the wiring terminals with (6) sensor terminals and (7) actuator terminals.

Or $$\begin{pmatrix} Q \\ f \end{pmatrix} = \begin{bmatrix} C(1-k^2) & nd_{33}K_a \\ -nd_{33}K_a & K_a \end{bmatrix} \begin{pmatrix} V \\ x \end{pmatrix} \quad (11)$$

where Q is the total electric charge on the electrodes of the transducer, x is the total extension, f is the total force, V the voltage applied between the electrodes of the transducer, C is the capacitance of the transducer with no external load (f=0), $K_a$ is the stiffness with short-circuited electrodes (V=0), k is the electromechanical coupling factor (dimensionless). For currently available high quality piezoelectric ceramics, k≈0.7. The main functional requirement for a piezoelectric actuator is the stroke (design requirement 4). The commercial piezo stack PSt 150/10×10/20 has been selected (FIG. 3), with cross-section, 10×10 mm², and height of 18 mm. The main requirement on the sensitivity of the force sensor is realized by selecting a multi-layer sensor with ten layers (PSt 150/10×10/2), see FIG. 3.

Mechanical Interface: In order to prevent damage to piezoelectric stacks, they are loaded axially, i.e., tilting and shearing forces should be avoided. Furthermore, piezoelectric stacks should preferably not be exposed to tensile forces. This implies that for dynamic applications in which it is desirable to have an equal push/pull force capacity, a preload force is provided (requirement 2). To limit the associated loss of travel, the stiffness of the preload spring is under 10% that of the piezo actuator stiffness. We selected a design value of the preload stiffness to be 5% of the piezo actuator stiffness, which is about 37.5 N/μm. This value represents the equivalent stiffness of the preload mechanism, which comprises three parts: the threaded central bolt, the flexible coupling shell, and the disc springs, FIG. 7. The flexible coupling shell has been designed such that its axial stiffness is very small compared to its torsional stiffness (see further).

Figure 7:
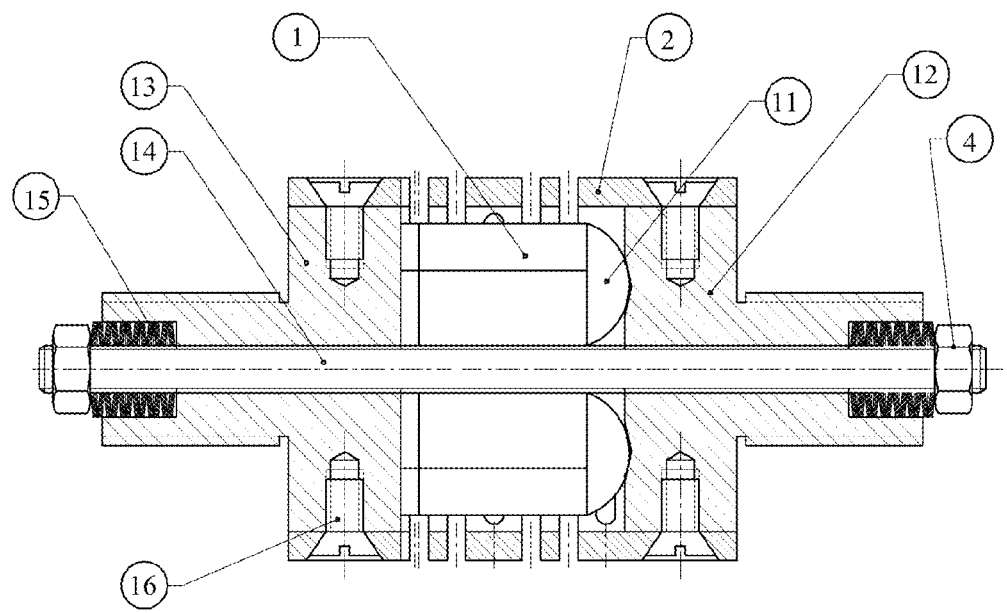
FIG. 7 is a cross-sectional view of the A3DSE showing the preload mechanism with the following elements: (1) actuator-sensor stacks, (11) hemispherical cap, (12) right port, (13) left port, (14) preload threaded bar, (15) disc springs, (4) preload nuts, (2) flexible shell coupling, and (16) set screws.
Figure 10:
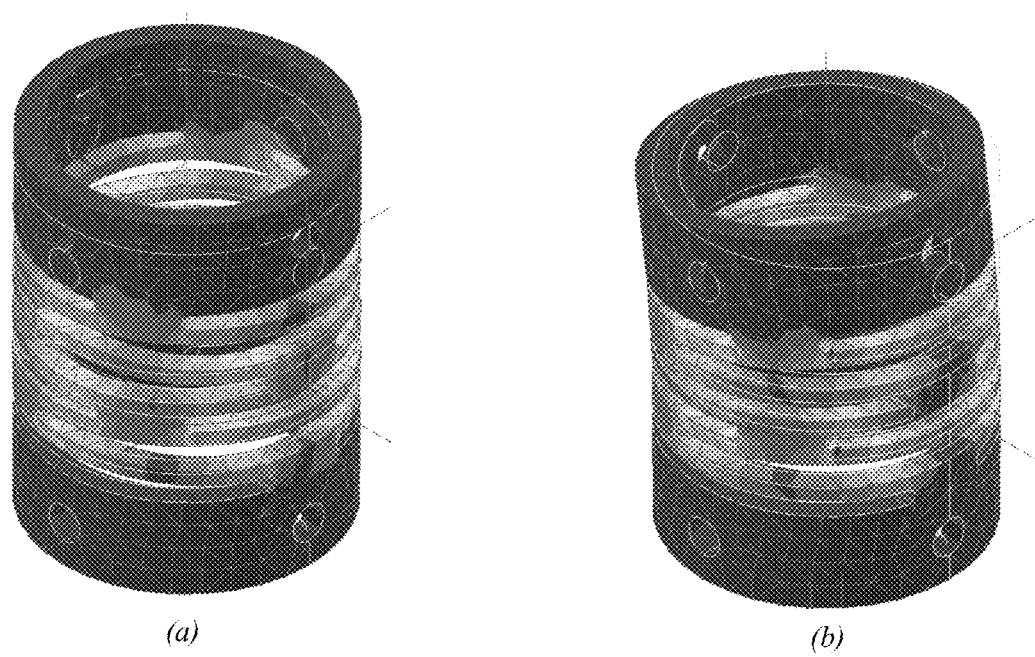
FIG. 10 illustrates the finite element model of the flexible-shell coupling (a) at the axial mode and (b) at the bending mode.

The flexible coupling shell should also have an axisymmetrically uniform bending stiffness, which is achieved by symmetric design of the peripheral slots (FIGS. 7 and 10). The finite element model of the flexible coupling shell is shown in FIG. 10: case (a) axial stiffness is 1.92 N/μm; case (b) bending stiffness for this mode is 39.8 N·m/deg. On the other hand, the torsional stiffness is about 1060 N·m/deg, which is sufficiently high to prevent accidental shear stresses being transmitted to the piezo stacks.

Design Requirements

To end up with a proper design of the A3DSE, the following design requirements preferably are fulfilled during the design process of the A3DSE. These requirements cover the general mechanical and control functionalities that grant a proper functionality of the A3DSE within the machine elements (struts) where it will be inserted:

1) The Active 3DOF Stiffness Element A3DSE preferably is able to deform independently at three degrees of freedom (DOFs) to be able to compensate for the vibration modes of the machine struts where the A3DSE will be inserted. The axial deflections (elongation/contraction) and the bending deflection at any direction preferably are measured and compensated for independently using a suitable number of sensor and actuator elements with an appropriate distribution, for example:
   a. Preferably, there are at least three independent piezoelectric position actuators within the A3DSE.
   b. Preferably, there are at least three independent piezoelectric force, displacement, velocity and/or acceleration sensors within the A3DSE.
   c. Preferably, the three actuator-sensor stacks are distributed with an axisymmetrical configuration with respect to the longitudinal central axis of the A3DSE.

2) As the actuator and sensor elements will be piezoelectric stacks, they should not be subjected to bending and shear stresses. This can be achieved by means of appropriate kinematic design of the mechanical interface.

3) In order to withstand tensile loads, the piezoelectric stacks preferably are subjected to a compressive preload force.

4) The piezoelectric actuator stacks should achieve the following requirements with regard to stroke and bandwidth:
   a. have sufficient stroke in order to compensate for the expected deformation/vibration mode levels;
   b. operate within a sufficiently large frequency range.

5) The piezoelectric force sensor stacks should, likewise, achieve the following requirements:
   a. the sensitivity preferably are sufficient enough for the expected force range to provide an appropriate feedback signal for position control;
   b. operate within a sufficiently large frequency range.

When other sensors (e.g., displacement, strain, velocity, acceleration) are used, they should likewise fulfill the requirements a and b above.

6) The Active 3DOF Stiffness Elements A3DSE preferably are able to be inserted within the machine structural elements, such as struts, in an appropriate way with sufficient strength and stiffness, for example:
   a. the A3DSE should have sufficient strength to withstand the expected mechanical load during operation, assembly and transport;
   b. the A3DSE should also have sufficient stiffness in comparison with the overall stiffness of the machine element where it will be inserted.

These requirements represent the objective of the design process of the different components of the A3DSE, and of the choice of the appropriate way to assemble them together.

The Piezoelectric Actuator-Sensor Stacks

Figure 2:
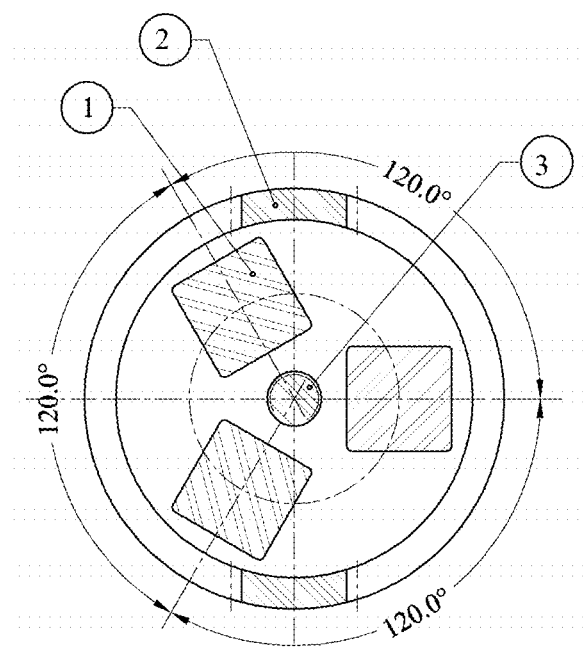
FIG. 2 is a cross-sectional view of the A3DSE with the following elements: (1) actuator-sensor piezoelectric stacks, (2) flexible shell coupling and (3) preload bolt.

The piezoelectric stacks within the A3DSE are the elements that provide the actual active compensation of the deflections modes, i.e., force measurement and position actuation. They are distributed axisymmetrically on a circle perpendicular to the longitudinal axis of the A3DSE at equal angles of 120°, with respect to the longitudinal central axis of the preload bolt as shown in FIG. 2. This distribution is represented by an equilateral triangle with a center of area at the axis of preload bolt, which guarantees:
   equal preload stress distribution for each piezoelectric stack;
   equal elongation/contraction to compensate the axial deflection modes; and
   the same controller could be used for each of the three piezoelectric stacks to compensate for the bending deflection modes, with a controlling action for each stack depending on the mode direction and the amount of deflection.

The sensor stacks are based on the direct piezoelectric effect, i.e., the application of a mechanical stress results in a proportional electrical charge. The actuator stacks are based on the inverse piezoelectric effect, i.e., the application of an electrical field results in a proportional elongation.

The actuator-sensor stacks are comprised of a multi-layer sensor stack on top of a multi-layer actuator stack with the same cross-section (but much longer than the sensor stack). Between the sensor and the actuator stacks, there is a passive ceramic layer. Also, there is a passive layer at the top and another one at the bottom of the actuator-sensor stack. The actuator and sensor stacks have been combined into a single element (see FIG. 3, with more details in FIG. 5). The side faces of the actuator-sensor stacks are coated by a silicone conformal coating thickness of approximately 0.1 mm. "This coating protects the brittle ceramics against "less" skillful handling, mechanical attack or chemical contamination," see Piezomechanik GmbH (2006).

Stack Design

In order to end up with a proper design of the actuator-sensor stack, a square cross-section of the stack has been chosen, although other configurations are possible. With respect to the cross-sectional area of the stacks, two practical constraints play a role. The limited space available within the A3DSE sets a maximum value for the cross-sectional area of each stack. Also, to increase the strength of the stacks, the cross-sectional areas preferably are increased as much as possible, so that the cross-section of the stack will just fit the available space between the coupling and the preload bolt. Some clearance should exist to avoid any mechanical contact between the stacks and the inside surface of the coupling shell or the preload bolt during operation and assembly. With respect to the length of the stacks, two practical constraints play a role. The desired stroke sets the minimum height of the actuator stack. The desired stroke is related to the amount of the vibration deflection that needs to be compensated for, and depends on the number of layers and the thickness of each layer of the piezoelectric multi-layer actuator stack. On the other hand, to increase the strength of the actuator-sensor stack, the total length is preferably kept as small as possible. The total height of the stack is the sum of the displacement actuator stack and the height of the force sensor stack and three passive ceramic chips. The height of the actuator stack has been chosen as the minimum height that could provide the desired stroke. Also, the height of the sensor stack has been chosen as the minimum height that could provide the sufficient sensitivity. Moreover, the thickness of the three passive ceramic chips has been chosen as small as possible with sufficient electrical and mechanical protection for the active stacks.

Requirement 6a states that the A3DSE should have sufficient strength to withstand the expected mechanical load during operation, assembly and transport. "The mechanical strength values of piezoelectric PZT ceramic material (given in the literature) are often confused with the practical long-term load capacity of a piezoelectric actuator. PZT ceramic material can withstand pressures up to 250 MPa ($250 \times 10^6$ N/m$^2$) without breaking. This value must never be approached in practical applications, however, because depolarization occurs at pressures on the order of 20% to 30% of the mechanical limit. For stacked actuators (which are a combination of several materials), additional limitations apply. Parameters such as aspect ratio, buckling, interaction at the interfaces, etc., must be considered" (PI Tutorial 2009).

Both the mechanical strength and the practical load capacity of an actuator-sensor stack depend on the cross-section of the stack. This implies that the maximum cross-section (determined by the limited space available within the A3DSE) directly determines the maximum expected load for the actuator-sensor stack. In this respect, let us assume that an actuator-sensor stack may be characterized by a single modulus of elasticity. In that case, the stiffness of the stack is given by:

$$k_s = \frac{A_{st} E_c}{h_{st}} \quad [\text{N/m}] \tag{1}$$

with $E_c$ [N/m$^2$] the modulus of elasticity for the (piezoelectric) ceramic material, and $A_{st}$ [m$^2$] and $h_{st}$ [m], respectively, the cross-section and the height of the stack. For the stiffness, similar as for the strength, it is beneficial to have a large cross-section. Both the maximum cross-section as well as the minimum height of the stack are limited by practical application-dependent considerations. The maximum cross-section, for instance, is mainly determined by the available space within a certain application. The minimum height of the actuator is directly related to the desired stroke as it is dependent upon the number of layers and the thickness of each layer of the multi-layer actuator stack, as will be shown in the next section.

Modeling the Piezoelectric Stacks

To describe the behavior of both a piezoelectric position actuator stack and a piezoelectric force sensor stack, we can use one of two sets of equations, linearly relating the electrical variables and the mechanical variables at the stack.

In case the voltage across a piezoelectric stack is taken as an independent variable, as in the case of force sensor stack:

$$\begin{pmatrix} x \\ q \end{pmatrix} = \begin{bmatrix} (k^U)^{-1} & d_{33} \\ d_{33} & C_{el}^F \end{bmatrix} \begin{pmatrix} F \\ U \end{pmatrix} \tag{2}$$

In case the charge across a piezoelectric stack is taken as an independent variable, as in the case of displacement actuator stack:

$$\begin{pmatrix} x \\ U \end{pmatrix} = \begin{bmatrix} (k^q)^{-1} & g \\ -g & (C_{el}^F)^{-1} \end{bmatrix} \begin{pmatrix} F \\ q \end{pmatrix} \tag{3}$$

In these equations, the following parameters are used to describe the behavior of a single layer piezoelectric stack, with thickness h [m], cross-sectional area A[m$^2$]:

F: tensional force applied [N]

U: voltage applied [V]

x: elongation built up [m]

q: charge built up [C]

$k^U = A/h \cdot s_{33}^E$: stiffness at constant voltage [N/m]

$k^q = A/h \cdot s_{33}^D$: stiffness at constant charge [N/m]

$C_{el}^F = A \cdot \epsilon_{33}^T / h$: capacitance at constant force [F]=[C/V]

$g = h \cdot d_{33} / A \cdot \epsilon_{33}^T$: piezoelectric voltage constant [V/N]=[m/C]

$s_{33}^E$: compliance for constant electric field [m$^2$/N]

$s_{33}^D$: compliance for constant electric displacement [m$^2$/N]

$\epsilon_{33}^T$: the permittivity under constant stress [F/m]=[C/V·m]

$d_{33}$: the piezoelectric charge constant [C/N]=[m/V]

The following relations hold:

$$g = \frac{d}{C_{el}^F} \text{ and } k^q = \frac{k^U}{1-(k_{33})^2}$$

Here, $k_{33}$ is the coupling coefficient of the piezoelectric material (material property is not depending on the geometric dimensions). "Coupling coefficients [dimensionless] are energy ratios describing the conversion from mechanical to electrical energy or vice versa. $(K_{33})^2$ is the ratio of energy stored (mechanical or electrical) to energy (mechanical or electrical) applied" (PI Tutorial 2009). A high value of the coupling coefficient is beneficial for conversion efficiency. For currently available high quality piezoelectric ceramics, $k_{33} \approx 0.7$. The most adequate description in a particular situation depends on the electrical conditions.

Piezoelectric Actuator Stack

The main functional requirement for a piezoelectric actuator stack often is that "it should have sufficient stroke, in order to compensate for the expected vibration modes levels" (design requirement 4a).

In this respect, it is interesting to note that in (2), the relation between the elongation x and the applied voltage U only depends on the piezoelectric charge constant $d_{33}$, which is a material parameter for a single-layer element. The absolute stroke of a single-layer actuator for a certain applied voltage thus does not depend on the thickness or the cross-section of the layer. The maximum elongation is limited by the maximum allowed voltage, which preferably are kept below the electric field causing dielectric breakdown (practical maximum $E_{max}=2$ [kV/mm]). On the other hand, the maximum contraction is limited by the maximum allowed negative voltage, which preferably are kept sufficiently small so as not to cause depolarization. For safety reasons, it is often recommended to use only positive voltages for a piezoelectric actuator.

The maximum stroke that can be obtained from an actuator, used in $d_{33}$-operation, thus is about 0.1% of its height. As a consequence, the minimum actuator height is directly determined by the desired maximum actuator stroke.

For currently available high-quality piezoelectric ceramics, the piezoelectric charge constant $d_{33}$ is about 600 [pC/N] (=[pm/V]). This implies that, in order to obtain 1 [µm] stroke out of a single-layer stack (FIG. 4a), the required voltage is as high as 1.7 [KV], which is not practical. In order to obtain a reasonable stroke for lower voltages, several piezoelectric elements may be stacked upon each other (FIG. 4b) to build multi-layer actuators with stacked layers, which may be as thin as 20 [µm] or less.

The stroke of a multi-layer piezoelectric actuator, for a driving voltage from 0 to 100 [V], is about 0.1% of the actuator length, when used in $d_{33}$ direction, PI Tutorial (2009). The used actuator material has been taken from a standard actuator available from Piezomechanik, GmbH. Properties of PZT-ceramic of actuator multi-layer stack:

| | |
|---|---|
| $d_{31}$ | −290 picometer/Volt |
| $d_{33}$ | +640 picometer/Volt |
| Dielectric constant $\epsilon$ | 5400 |
| Curie temperature TC | 155° C. |
| Density | 8 g/cm³ |
| Elastic compliance $s_{33}$ | $18 \times 10^{-12}$ m²/N |

Figure 5:
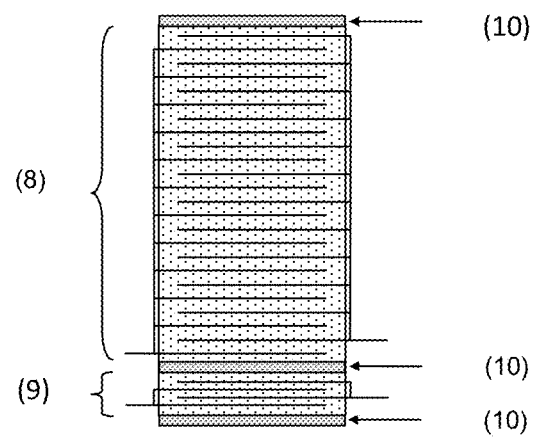
FIG. 5 is a cross-sectional layout of an actuator-sensor stack with (8) actuator stack plus electrodes, (9) sensor stack plus electrodes, and (10) passive chips.

The so-called piezo stack (PSt 150/10×10/20) has been selected for the actuator stack FIG. 5, with cross-section 10×10 [mm²], and height 18 [mm], maximum volt range (−30V/+150V), maximum stroke 28/20 [µm] for semi-bipolar (−30V/+150V)/unipolar (0V/+150V) activation, capacitance of 7200 [nF], stiffness 250 [N/µm], blocking force 7000/5000 [N] for semi-bipolar/unipolar activation, and maximum allowable load force 8000[N] (Piezomechanik GmbH, 2006).

Piezoelectric Sensor Stack

The main requirement for a piezoelectric force sensor is that "the sensitivity preferably is sufficient to provide an appropriate feedback signal for position control" (requirement 4a). In this section, the influence of the dimensions (especially the thickness) of the multi-layer sensor stack and the number of layers on the sensitivity of the force sensor is shown.

The primary variable of interest at the electrical port of a piezoelectric sensor is the charge that results from an applied force. This can be seen from eq. (2): for a single-layer element, the charge at the electrodes upon application of a force only depends on the piezoelectric charge constant $d_{33}$, and not on the geometric dimensions of the element. The voltage that may in turn result at the electrodes does not depend on the dimensions.

For the sensor piezoelectric stack to be used, the cross-section of the sensor is the same as the cross-section of the actuator. In case of a single-layer sensor, the layer thickness then is the only free design variable. A small thickness is preferable, both from a mechanical point of view (high stiffness, requirement 1b) and from an electrical point of view, the generated charge is not dependent upon the geometrical dimensions of the stack.

In case a multi-layer element is considered for use as a force sensor, the charge that is produced upon application of a force grows linearly with the number of layers. The use of a multi-layer element thus is beneficial to increase the sensitivity. For the A3DSE prototypes considered in this report, a multi-layer sensor with a reasonable number of layers (10 layers) has proven sufficiently sensitive. The used sensor piezoelectric material was obtained from a standard Piezo-chips available from Piezomechanik, GmbH. Properties of PZT-ceramic of the sensor multi-layer stack:

| | |
|---|---|
| $d_{31}$ | −240 picometer/Volt |
| $d_{33}$ | +580 picometer/Volt |
| Dielectric constant $\epsilon$ | 1900 |
| Curie temperature TC | 250° C. |
| Density | 7.5 g/cm³ |
| Elastic compliance $s_{33}$ | $20 \times 10^{-12}$ m²/N |

The so-called piezo stack (PSt 150/10×10/2) has been selected for the sensor stack (FIG. 5) with cross-section 10×10 [mm²], height 2 [mm] equivalent to 10 active layers, maximum volt range (−30V/+150V), maximum stroke 3/2 [µm] for semi-bipolar/unipolar activation, capacitance of 480 [nF], stiffness 1900 [N/µm], blocking force 6000/4000 [N] for semi-bipolar/unipolar activation, and maximum allowable load force 10000[N] (Piezomechanik GmbH, 2006).

Passive Ceramic Chips

As the electrodes of the sensor-actuator stack are preferably electrically and mechanically insulated, three passive ceramic square thin chips (end-pieces) are necessary. Two of them are at the top of the actuator stack and the bottom of the sensor stack in order to prevent accidental short-circuiting between the end lead and the mechanical connection surfaces. A third passive ceramic chip is between the sensor and the actuator stacks to provide electrical, and also some mechanical, isolation (reduce the mechanical cross-talk). All three chips have the same cross-section as the sensor and actuator stacks 10×10 [μm²], and a thickness of 0.2 [mm] have been used. FIG. 5 shows the three passive ceramic chips (3) within the actuator-sensor stack.

Mechanical Interface

With respect to the mechanical interface, the design issues involved in the compressive preload mechanism for the actuator-sensor stack will be discussed first and then the design of the outer flexible coupling will be discussed.

In order to prevent damage to piezoelectric stacks, they should only be loaded axially, i.e., tilting and shearing forces preferably are avoided. Furthermore, piezoelectric stacks should preferably not be exposed to tensile forces. This implies that for dynamic applications, in which it is desirable to have an equal push/pull force capacity, a preload force is necessary (PI Tutorial, 2009).

Figure 6:
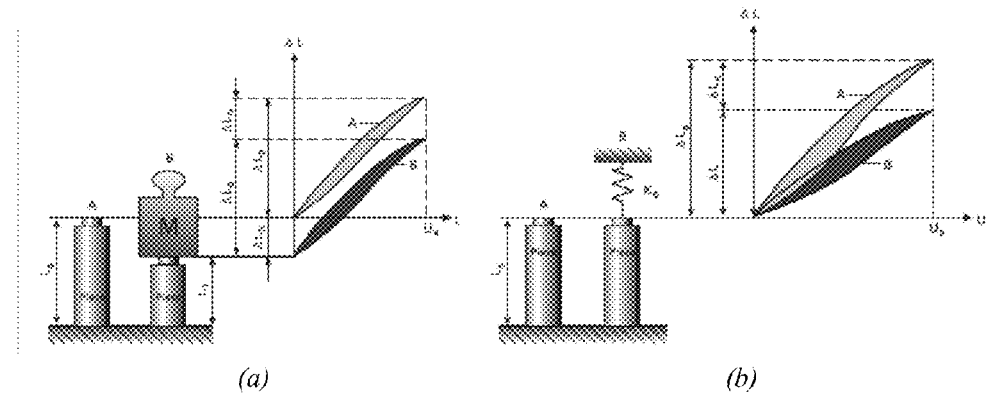
FIG. 6 illustrates (a) zero point offset with constant preload and (b) effective displacement against a spring preload (PI Tutorial 2009)

A preload force can be realized in two ways: by a gravitational force or by the use of an elastic element compressing the stack. In general, a gravitational force is preferred above an elastic element, because the latter results in a loss of actuator stroke as shown in FIG. 6. For the A3DSE design, it has been decided to use a central bolt as the additional functional preload element. The preload bolt, as well as the accompanying nuts, are described in detail in the next section.

With respect to the issue of preloading, it preferably is noted that for symmetry reasons, a choice had to be made between either (1) three piezoelectric stacks at the core and three or more preload bolts at the outer side of the A3DSE, in an accurate axisymmetrically arrangement, or
(2) single preload bolt at the center surrounded by three piezoelectric stacks in an axisymmetrically arrangement (FIG. 2).

Option (1) brings about a difficulty in achieving symmetry, as symmetry would need equal stress in the bolts at an accurate axisymmetrical arrangement. This, in turn, includes that all preload bolts preferably are tightened equally with the same amount of the preload force, with the same stiffness, and with accurate angular axisymmetrical arrangement with respect to the stacks, which is difficult to ensure in practice. Also, for bending modes deflection compensation, the total bending stiffness of the A3DSE will increase affected by the axial stiffness of the preloaded bolts and the radial distance from the central axis. When using a single preload bolt, these difficulties are overcome. Therefore, option (2) has been chosen (FIG. 2).

Mechanical Preloading

Due to the brittle nature of ceramics, an actuator-sensor stack should preferably not be exposed to tensile forces (PI Tutorial 2009). This implies that for dynamic applications, in which it is desirable to have a significant pull force capacity, "in order to withstand tensile loads, the stacks are preferably subjected to a compressive preload force" (requirement 2b).

A preload force can be realized in two ways: by a gravitational force due to a mass on top of the stack when it is in a vertical orientation, or by the use of an elastic element that compresses the stack where the stack could be in any orientation with respect to gravity. In general, a gravitational force is preferred above an elastic element because the latter results in a decrease of the maximum actuator expansion, as it is added resistance stiffness to the stack causing decrease in the stroke. From the design point of view, the A3DSE will be connected to the machine element at any orientation during the machine movements, so it is not possible to always keep it at vertical positions with a gravitational preload weight. This implies that, in order to achieve equal push/pull force capacity, an additional elastic element is necessary to achieve the desired level of preloading.

The decrease of the actuator expansion will be illustrated with the aid of FIG. 6, which represents an unloaded actuator-sensor stack with a length at rest (U=0) equal to $L_0$, and a maximum expansion $\Delta L_0$.

Situation (a): a mass is installed on the top of the piezo-actuator, which applies a force:

F=M·g (M is the mass, g the acceleration due to gravity) FIG. 6, panel (a). The zero-point will be shifted by:

$$\Delta L_N \cong \frac{F}{k_T} \; [m] \quad (4)$$

where $k_T$ is the stiffness of the actuator. If this force is below the specified load limit, full displacement can be obtained at full operating voltage.

For piezo-actuator operation against an elastic load, different rules apply. Part of the displacement generated by the piezo effect is lost due to the stiffness of the preload spring (FIG. 6, panel (b). The total available displacement can be related to the spring stiffness by the following equations:

$$\Delta L \cong \Delta L_0 \left( \frac{k_T}{k_T + k_S} \right) \; [m] \quad (5)$$

The maximum loss of displacement due to external spring force:

$$\Delta L_R \cong \Delta L_0 \left( 1 - \frac{k_T}{k_T + k_S} \right) \; [m] \quad (6)$$

Where: $k_T$=piezo actuator stiffness [N/m]; $k_s$=spring stiffness [N/m].

Preload Stiffness

"To keep down the loss of travel, the stiffness of the preload spring preferably are under 10% that of the piezo actuator stiffness" (PI Tutorial 2009). The stiffness of each actuator stack (PSt 150/10×10/20) is 250 [N/μm] and we have three of these actuators in parallel, so the recommended stiffness of the preload bolt mechanism preferably is less than 75 [N/μm]. The selected design value of the preload stiffness will be set to 5% of the piezo actuator stiffness, which will be about 37.5 [N/μm]. This value represents the equivalent stiffness of the preload mechanism, which comprises three parts: the threaded preload central bolt, the flexible-shell coupling, and the disc springs, FIG. 7.

Preload Bolt Design

For the actuator-sensor stacks; the dynamic force capacity in a particular embodiment is assumed to be given by the push/pull force capacity of the three piezo-stacks actuator (PSt 150/10×10/20) blocking force 7000/5000 [N] for semi-bipolar/unipolar activation. For the A3DSE, from safety point of view, the pull force capacity will be neglected and the applicable voltage range will be limited from 0 to +100 [V], which give a maximum push force of 3300[N] for each actuator. For dynamic applications, in which it is favorable to have an equal push/pull force capacity, mechanical preloading should result in an offset force halfway of the original push/pull force range. By doing this, and subsequently by applying a static offset voltage halfway of the applicable voltage range at (+50 [V]), a static situation is created enabling a maximum preload shortening of the stack equal to the maximum elongation, and also a maximum pulling force equal to the maximum pushing force.

For the piezo stacks selected, neglecting the pull force capacity, limiting the applicable voltage range to +100 [V], and taking into account that there are three actuator stacks in parallel, the desired preload force can be calculated to be:

$$F_{preload}=50\% \ (3\times3300)=5000 \ [N] \tag{7}$$

The desired elastic preload force, together with the yield stress of the steel bolt grade 8.8 (640 MPa), determines the minimum diameter of the preload bolt with a factor of safety (2):

$$d_{bolt} = \sqrt{\frac{F_{preload} \times (F.O.S)}{\frac{\pi}{4} \times S_y}} = \sqrt{\frac{5000 \times 2 \times 4}{\pi \times 640 \times 10^6}} = 4.46 \ [mm] \tag{8}$$

There will be part of the bolt under tension, as shown in FIG. 7, to be 80 [mm], resulting in the following stiffness for the slender part of the bolt steel grade 8.8 (with Young's modul as $E_{steel}=210\times10^9$ [N/m$^2$]):

$$k_{bolt} = E_{steel} \frac{A_{bolt}}{l_{tension}} = 5.15 \times 10^7 \ [N/m] = 51.5 \ [N/\mu m] \tag{9}$$

This calculated value is still higher than the desired value. By adding flexible elements such as spring washers with a suitable number and configuration, the desired stiffness value could be reached.

The Flexible-Shell Coupling

Figure 8:
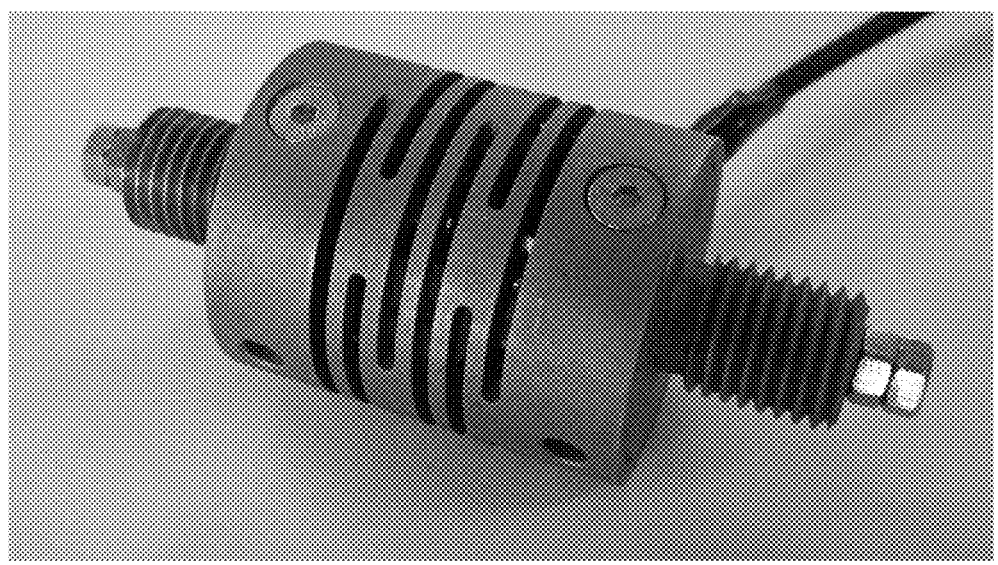
FIG. 8 is a photograph of the A3DSE with the flexible-shell coupling and the preload bolt and nuts.
Figure 9:
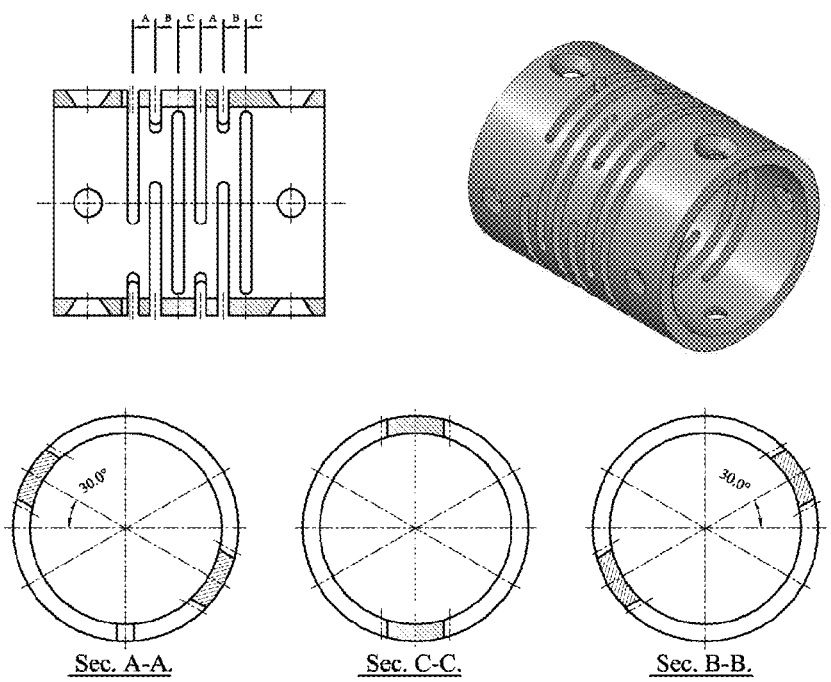
FIG. 9 are cross-sectional views of the flexible shell coupling and at different planes.

The flexible-shell coupling has been designed such that the axial stiffness is relatively small to decrease the loss of piezoelectric actuator stroke due to external spring force added by the axial stiffness of the coupling (see FIGS. 8 and 9). For the torsional stiffness, it is sufficient to constrain the relative axial rotation of the two side's connections of the A3DSE. This relative rotation could be due to accidentally transmitted torque during handling or mounting the A3DSE within the struts. This relative rotation motion will cause undesired shear stress in the piezo stacks, design requirement 2.

To be able to use the same controller for all of the three piezoelectric stacks to compensate for the bending deflection modes independently, the flexible-shell coupling should have the same axisymmetrical bending stiffness at the three longitudinal planes where the piezo stacks are located. Examining cross-sections A-A, B-B, and C-C (FIG. 9), it is found that the flexible-shell coupling at these three planes has the same configuration, dimensions, and the same even number of flexure blade slots.

The finite element model of the flexible-shell coupling is shown in FIG. 10. Case (a) is the axial mode where all the three piezoelectric stacks are in the same face together. The axial stiffness for this mode is 1.92 N/μm. Also, for 20 μm axial expansion, the factor of safety is about 15. Case (b) is the bending mode where not all the three piezoelectric stacks are in the same face. The bending stiffness for this mode is 39.8 N·m/deg. Also, for ±20 μm at the opposite side of the bending plane will cause a bending deflection of 1°, and the factor of safety is about 38. On the other hand, the torsional stiffness is about 1060 N·m/deg, which is a practical value to prevent accident shear stress, which could be transmitted through the piezo stacks.

The Piezo-Stack Hemispheres Connections

During the bending mode, the piezo stacks will expand with different ratios according to the control scheme, depending on:
- the bending plane, where the bending deflection will take place;
- if there is an equivalent complex mode of axial and bending deflections; or
- the amount of the deflection that needs to be generated.

The result is that the two connection sides of the A3DSE will have relative rotation, and their two inside surfaces, where the three sensor-actuator stacks are inserted, will not remain parallel at that moment. If the piezo stacks are directly preloaded, without joints, there will be an eccentric loading that will cause breaking of the piezo stacks. Avoiding the eccentric loading can be ensured by the use of ball tips, flexible tips, elastic hinges, or adequate guiding mechanisms, etc.

To make the A3DSE design as simple as possible, the ball tips have been chosen for these reasons:
- much stiffer than other options (flexible or guiding mechanisms);
- more compact (height is less than half the width of the piezo stack) (see FIG. 10, panel (a)); or
- simple machining part (just half of sphere).

A hemisphere diameter has to be smaller than the width of the piezo stack to avoid any contact between the hemisphere and the outer brittle side coating layer of the piezo stacks. If there is any mechanical load transmitted through this outer brittle coating, it is easily broken. These hemispheres will be glued at the top of the actuator using hard strength glue (FIG. 11, panel (a)). The additional function of the glue, besides keeping the hemisphere in position with respect to the piezo stacks, is to fill any cavities between the two surfaces, to avoid contact stress concentrations that could result in breaking the piezo stacks.

Figure 11:
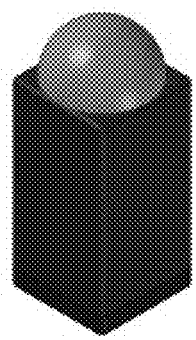
FIG. 11 depicts the piezo stack hemispheres connections, (a) hemisphere glued with the piezo stack, (b) the cone indents, and (c) and (d) assembly of the piezo stacks.
Figure 11:
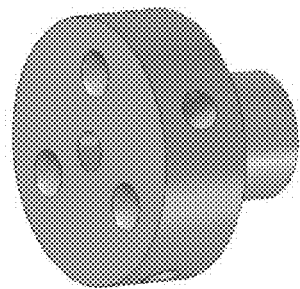
Figure 11:
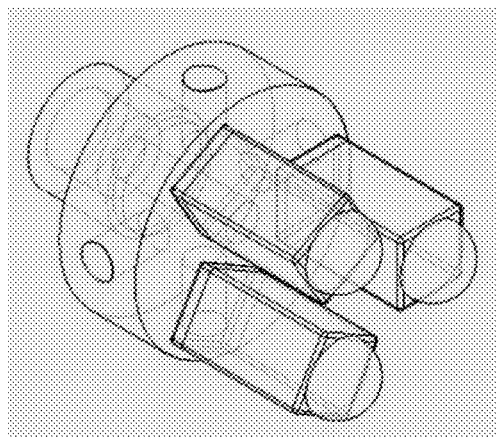
Figure 11:
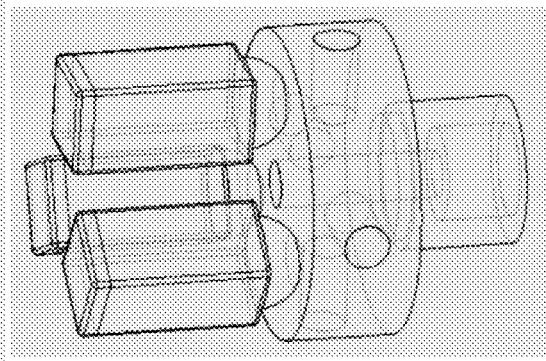

During the preload and assembly process, it has been found that three indentations, very small cone (d=3 mm, h=1 mm), at the exact three spots (FIG. 11, panel (b)) where the hemispheres will be in contact with the inside face of the right side, will help to have a proper orientation for the piezo stacks (FIG. 11, panel (d)). The possibility of the hemisphere to perform the joystick motion with respect to the cone indentation will help to prevent transmitting bending moment through the body of the sensor-actuator stack.

| Technical data | |
|---|---|
| Input volt range | from 0 to +100 [V] |
| Max. push/pull force capacity | ±5000 [N] |
| Axial stroke range | ±6.65 [μm] |
| Bending range | ±1 · 10$^{-3}$ [deg] |
| Actuator stack: | |
| cross-section | 10 × 10 [mm$^2$] |
| height | 18 [mm] |
| stiffness | 250 [N/μm] |
| capacitance | 7200 [nF] |
| blocking force | 5000 [N] |
| maximum allowable load force | 8000 [N] |
| $d_{33}$: the piezoelectric charge constant = | 133 10$^{-9}$ [C/N] = [m/V] |
| Force sensor sensitivity | |
| Sensor stack: | |
| cross-section | 10 × 10 [mm$^2$] |
| height | 2 [mm] |
| stiffness | 1900 [N/μm] |
| capacitance | 480 [nF] |
| blocking force | 5000 [N] |
| maximum allowable load force | 10000 [N] |

| Technical data | |
|---|---|
| $d_{33}$: the piezoelectric charge constant = | $13.3 \cdot 10^{-9}$ [C/N] = [m/V] |
| Force sensor sensitivity | |
| max. output charge | ±66,500 [pC] |

Figure 12:
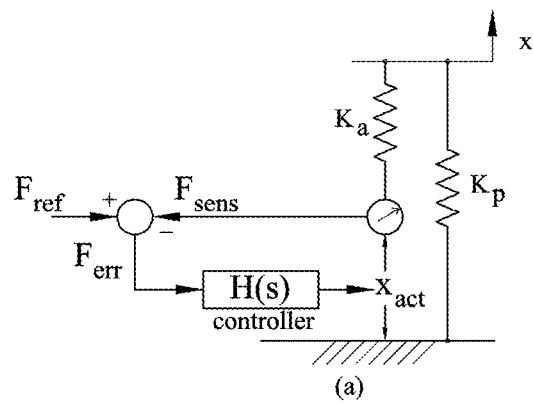
FIG. 12 is a schematic of a one actuator-sensor stack model for active vibration isolation.

Modeling of the Active Stiffness Element: Here, we briefly explain the main idea behind the active vibration control strategy by considering only one of the three stacks. We consider two control configurations corresponding to active isolation and active damping, as depicted schematically in FIGS. 12 and 13, respectively.

The actuator, the sensor and the contact stiffness (in series) can be modeled as a single stiffness element $K_a$, with a force sensor $F_{sens}$ and a position actuator $X_{act}$. This system is in parallel with the preload stiffness $K_p$. The elastic force $F_{sens}$ in the spring $K_a$ is measured, and fed back through the controller H(s), which generates a desired position for the actuator, so as to actively counteract the measured vibrations.

$$X_{act} = H(s) F_{sens} \quad (12)$$

In order to achieve robust active damping, the only model knowledge that is needed is the fact that the position actuator and the force sensor are collocated. This in turn implies that, according to the used controller, different functionalities for the active stiffness element will be obtained.

Active Force Isolation within the A3DSE: If the direct measured force $F_{sens}$ signal is used as a feedback signal (FIG. 12) with a suitable integral controller $H(s) = K_{eff}/s$, the effect of this controller will be to eliminate the force transmitted to the ground.

Active Damping within the A3DSE: If we impose a linear relation between the actuation measured force and the port's relative velocity $\dot{x}$, we obtain active damping. The relationship between the measured force $F_{sens}$ and the port relative displacement is $$X = \frac{F_{sens}}{K_a} + X_{act}. \quad (13)$$

Figure 13:
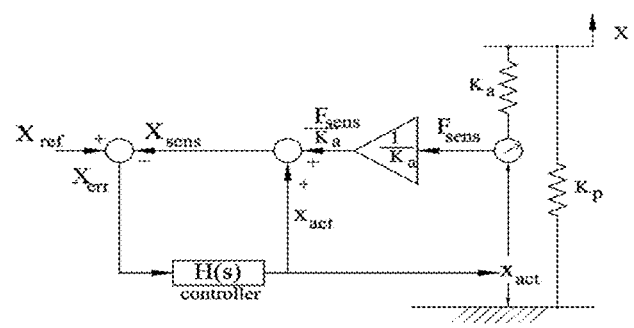
FIG. 13 is a schematic model of the active damping controller.

Using this, we obtain the control scheme of FIG. 13, with $(H(s) = K_{IFF}/s)$ corresponding to Integral Force Feedback (IFF).

Figure 14:
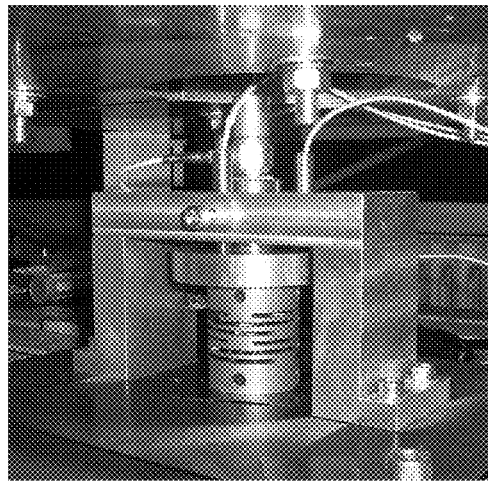
FIG. 14 is a photograph of an experimental setup.
Figure 15:
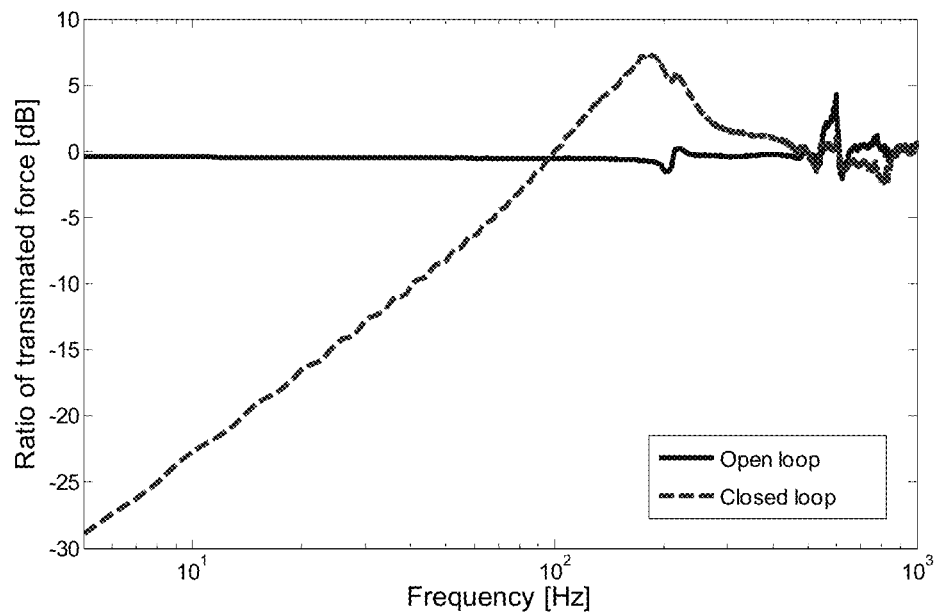
FIG. 15 is a graph that illustrates active force isolation within the A3DSE.
Figure 16:
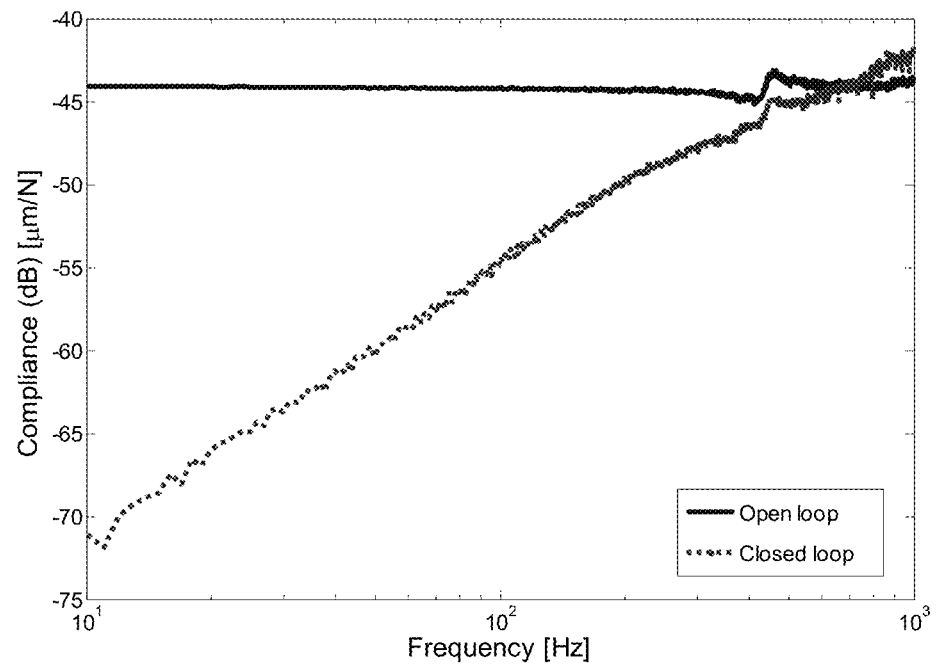
FIG. 16 is a graph that illustrates active damping within the A3DSE.

Experimental Results: An experimental set-up has been designed and built (FIG. 14). The A3DSE is mounted to a rigid foundation from the bottom and connected from the top to a target plate, force sensor and the pointer of the shaker, which is mounted in a high stiffness frame. To measure the 3DOF displacement, three displacement sensors are mounted in C-shape frame, in vertical direction, each above one of the three piezo stacks. With this setup, two primary experiments have been performed to evaluate the active system performance for the two applications mentioned in the previous section. In the first experiment, a sinusoidal disturbance force with amplitude 50 N was applied to the element, in a frequency range from 10 Hz to 1 kHz, and the controller of section 5.1, tuned to minimize the transmitted force ($F_{sens}$). FIG. 15 shows that the active element is effective as force isolator in the low frequency range up to 100 Hz (cross-over). Note that the controller is not optimized yet. The second experiment uses the controller of section 5.2 to damp out the vibrations at the top of the element. The same sinusoidal disturbance force used as in the first experiment. As shown in FIG. 16, the active element is able to compensate for disturbances on a wide frequency range up to 700 Hz.

The A3DSE element, equipped with appropriate control, is an effective device for a variety of active disturbance-rejection applications. We have shown this to be true for at least two cases, namely (i) active force isolation, and (ii) active vibration damping.

Other embodiments of the invention will be apparent to those skilled in the art from consideration of the specification and practice of the invention disclosed herein. It is intended that the specification and examples be considered as exemplary only, with the true scope of the invention being indicated by the following claims.

Some embodiments of the invention are set forth in claim format directly below:

1. A three-degree-of-freedom actuator/transducer element comprising at least three actuators and force sensors at one end of the actuators, which are preloaded in a housing by a low-stiffness tension bar, and are constrained by means of a flexible shell against shear force and torsion moment.

2. The element of embodiment 1, whereby at least three actuators are parallel along the X axis or longitudinal axis of the three-degree-of-freedom actuator/transducer element.

3. The element of any one of the previous embodiments, whereby actuators have, comprise or integrate a force sensor at one end and a ball-shaped protrusion at the other end.

4. The element of embodiment 1, whereby each actuator with force sensor is a force sensor integrated stack.

5. The element of embodiment 3 or 4, whereby each of the actuators with force sensor- or of the force sensor integrated stack the force sensor contacts or supports on a flat port and the ball-shaped protrusion fits in or is anchored in a concave pit in the other port.

6. The element of any one of the previous embodiments, whereby the actuators are a type of the group consisting of a piezoceramic actuator, hydraulic actuator, Lorenz actuator and magnetostrictive actuator.

7. The element of any one of the previous embodiments, whereby the tension bar comprises preload bolts, preload nuts and spring elements to absorb tensile forces.

8. The element of any one of the previous embodiments, whereby the low stiffness of the tension bar has a value that is an order-of-magnitude lower than the stiffness of the actuators.

9. The element of any one of the previous embodiments, whereby the actuator and its force sensor form an integrated stack along or parallel with the longitudinal axis of the three-degree-of-freedom actuator/transducer element.

10. The element of any one of the previous embodiments, whereby the three-degree-of-freedom actuator/transducer element is a dynamic three-degree-of-freedom actuator/transducer element.

11. The element of any one of the previous embodiments, whereby the actuators, force sensor-integrated stacks are parallel along the X axis or longitudinal axis of the three-degree-of-freedom actuator/transducer element.

12. The element of any one of the previous embodiments, whereby the flexible shell is foreseen with longitudinal excisions (slots or grooves) at least in part axial around the axis of the three-degree-of-freedom actuator/transducer element or in circumferential direction around the three-degree-of-freedom actuator/transducer element.

13. The element of any one of the previous embodiments, whereby the shell prevents torsion but is extendible and contractible along its longitudinal axis (X axis), in the axial direction and in the two-tilt directions.

14. The element of any one of the previous embodiments, having at each end a screw thread with which it can be connected to a structure or element in order to exert force or moments on it.

15. The element of any one of the previous embodiments from 1 to 14, in which the actuators are piezoceramic actuators which are of the low voltage, multi-layer type.

16. The element of any one of the previous embodiments from 1 to 14, in which the actuators are piezoceramic actuators of the high voltage, single or multiple crystal type.

17. The element of any one of the previous embodiments from 1 to 14, in which the actuators are magnetostrictive actuators.

18. The element of any one of the previous embodiments, which when powered by an external voltage source, this actuator/transducer is able to generate a dynamical axial force and displacement and dynamical bending and moment in the two principal tilt degrees of freedom around two orthogonal axes perpendicular to the principal displacement.

19. The element of any one of the previous embodiments, which, when subjected to an axial force or a tilting moment, the transducer is able to generate a charge, electrical signals or optical signals that are proportional to the exerted force and moments.

20. The element of any one of the previous embodiments, whereby a force sensor can produce a signal indicative of force and a controller can control and activate the programmable actuators to adapt the actuators in relation to these forces.

21. The element of any one of the previous embodiments, whereby the force sensors are connected or connectable with a computer comprising a controller or with an electronic controller to process the sensor signals into a signal that activates the actuator.

22. The element of any one of the previous embodiments, whereby the force sensors are in connection to transducers to transfer this in electrical signals that can be sensed by a computer or electronic controller.

23. The element of any one of the previous embodiments, whereby the element comprises force sensors or other detectors that are disposed within the three-degree-of-freedom actuator/transducer element and configured to record a quantity of forces, displacements, velocities or accelerations, according to a recording protocol and generate an information signal representing the quantity, and whereby the element connected with a device for monitoring and collecting a quantity associated with the sensors, the device comprising: a memory coupled to the detector and configured to store data representing the information signal, and a transponder coupled to the memory and configured to transmit the data in response to receiving an interrogation signal.

24. The element of any one of the previous embodiments integrated in a microdevice (for instance, micropositioning systems).

25. The element of any one of the previous embodiments integrated in a mesosystem (e.g., as a machine tool in a machine).

26. The element of any one of the previous embodiments integrated in a macrosystem (e.g., a building or bridges) for tempering of vibration.

REFERENCES

Preumont, A. (2002), Vibration Control of Active Structures—An Introduction 2nd Edition, Kluwer Academic Publishers, Dordrecht, the Netherlands.

Piezomechanik GmbH (2006), Low voltage co-fired multi-layer stacks, rings and chips for actuation, Online Catalog: http://www.piezomechanik.com/en/home/allcatalogs/index.html.

PI Tutorial (2009), Piezoelectrics in Positioning, Online Tutorial: on the worldwide web physikinstrumente.com/en/products/piezo_tutorial.php.

What is claimed is:

1. A three-degree-of-freedom actuator/transducer element comprising at least three actuators with a force sensor at one end of each of the at least three actuators that are preloaded in a housing by a low-stiffness tension bar, and are constrained, by means of a flexible shell, against shear force and torsion moment.

2. The element of claim 1, wherein each of the at least three actuators are parallel along the X axis or longitudinal axis of the three-degree-of-freedom actuator/transducer element.

3. The element of claim 1, wherein each of the at least three actuators comprise a force sensor at one end and a ball-shaped protrusion at the other end.

4. The element of claim 1, wherein each of the at least three actuators with force sensor is a force sensor integrated stack.

5. The element of claim 3, wherein each of the actuators with force sensor contacts or supports on a flat port, and the ball shaped protrusion fits in or is anchored in a concave pit in another port.

6. The element of claim 1, wherein the actuators are selected from the group consisting of a piezoceramic actuator, hydraulic actuator, Lorenz actuator, and magnetostrictive actuator.

7. The element of claim 1, wherein the tension bar comprises preload bolts, preload nuts, and spring elements to absorb tensile forces.

8. The element of claim 1, wherein the tension bar has a stiffness value that is an order-of-magnitude lower than the stiffness of the actuators.

9. The element of claim 1, wherein each of the at least three actuators and its force sensor form an integrated stack along or parallel with the longitudinal axis of the three-degree-of-freedom actuator/transducer element.

10. The element of claim 1, wherein the three-degree-of-freedom actuator/transducer element is a dynamic three-degree-of-freedom actuator/transducer element.

11. The element of claim 1, wherein each of the at least three actuators are parallel along the X axis or longitudinal axis of the three-degree-of-freedom actuator/transducer element.

12. The element of claim 1, wherein the flexible shell is foreseen with longitudinal excisions at least in part axial around the axis of the three-degree-of-freedom actuator/transducer element or in circumferential direction around the three-degree-of-freedom actuator/transducer element.

13. The element of claim 1, wherein the flexible shell prevents torsion, but is extendible and contractible along its longitudinal axis (X axis), in the axial direction and in the two tilt directions.

14. The element of claim 1, having at each end a screw thread with which it can be connected to a structure or element in order to exert force or moments on it.

15. The element of claim 1, in which the actuators are piezoceramic actuators that are of the low voltage, multi-layer type.

16. The element of claim 1, in which the actuators are piezoceramic actuators of the high voltage, single or multiple crystal type.

17. The element of claim 1, in which the actuators are magnetostrictive actuators.

18. The element of claim 1, which when powered by an external voltage source, the actuator/transducer is able to generate a dynamical axial force and displacement and dynamical bending and moment in the two principal tilt degrees of freedom around two orthogonal axes perpendicular to the principal displacement.

19. The element of claim 1, which when subjected to an axial force or a tilting moment, the transducer is able to generate a charge, electrical signals or optical signals that are proportional to the exerted force and moments.

20. The element of claim 1, wherein a force sensor can produce a signal indicative of force and a controller can control and activate the programmable actuators to adapt the actuators in relation to these forces.

21. The element of claim 1, wherein the force sensors are connected or connectable with a computer comprising a controller or with an electronic controller to process sensor signals into a signal that activates an actuator.

22. The element of claim 1, wherein the force sensors are in connection to transducers to transfer this in electrical signals that can be sensed by a computer or electronic controller.

23. The element of claim 1, wherein the element comprises force sensors or other detectors that are disposed within the three-degree-of-freedom actuator/transducer element and configured to record a quantity of forces, displacements, velocities or accelerations, according to a recording protocol and generate an information signal representing the quantity, and wherein the element connected with a device for monitoring and collecting a quantity associated with the sensors, the device comprising:
   a memory coupled to the detector and configured to store data representing the information signal; and
   a transponder coupled to the memory and configured to transmit the data in response to the receiving of an interrogation signal.

24. The element of claim 1, integrated in a microdevice.

25. The element of claim 1, integrated in a mesosystem.

26. The element of claim 1, integrated in a macrosystem for tempering of vibration.

27. The element of claim 4, wherein each force sensor integrated stack contacts or supports on a flat port, and the ball-shaped protrusion fits in or is anchored in a concave pit in another port.

* * * * *